(12) United States Patent
Kumar et al.

(10) Patent No.: US 10,304,816 B2
(45) Date of Patent: May 28, 2019

(54) SEMICONDUCTOR DEVICE INCLUDING STACKED DIE WITH CONTINUOUS INTEGRAL VIA HOLES

(71) Applicant: Western Digital Technologies, Inc., San Jose, CA (US)

(72) Inventors: Shiv Kumar, Saharanpur (IN); Chin Tien Chiu, Taichung (TW); Honny Chen, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/394,986

(22) Filed: Dec. 30, 2016

(65) Prior Publication Data

US 2017/0309608 A1 Oct. 26, 2017

(30) Foreign Application Priority Data

Apr. 25, 2016 (CN) .......................... 2016 1 0260314

(51) Int. Cl.
*H01L 25/04* (2014.01)
*H01L 25/07* (2006.01)
(Continued)

(52) U.S. Cl.
CPC ........ *H01L 25/50* (2013.01); *H01L 21/76802* (2013.01); *H01L 21/76879* (2013.01);
(Continued)

(58) Field of Classification Search
CPC . H01L 25/50; H01L 25/0657; H01L 23/3114; H01L 23/5226; H01L 23/528;
(Continued)

(56) References Cited

U.S. PATENT DOCUMENTS 4,897,708 A * 1/1990 Clements ...................... 257/773
5,682,062 A * 10/1997 Gaul ...................... H01L 23/481
257/686

(Continued)

FOREIGN PATENT DOCUMENTS

CN 101425508 A 5/2009
CN 102820283 A 12/2012

OTHER PUBLICATIONS

Office Action dated Dec. 27, 2017 in Taiwan Patent Application No. 105144304.
(Continued)

*Primary Examiner* — Ida M Soward
(74) *Attorney, Agent, or Firm* — Vierra Magen Marcus LLP (57) ABSTRACT

A semiconductor device and a fabricating method of semiconductor device are disclosed. The semiconductor device includes: a substrate having a bonding pad on a surface of the substrate; at least two semiconductor components each having a first surface and a second surface opposite the first surface, the semiconductor components stacked on top of each other on the surface of the substrate via a layer of component attach material attached on the second surface of the respective semiconductor component; an integral through via hole extending completely through the semiconductor components and the layers of component attach material and having a substantially uniform diameter along an extending direction of the integral through via hole aligned with the bonding pad on the surface of the substrate, and a continuous conductive material filled in the integral through via hole and in physical and electrical contact with the bonding pad of the substrate.

13 Claims, 10 Drawing Sheets

(51) Int. Cl.
  *H01L 25/11* (2006.01)
  *H01L 23/31* (2006.01)
  *H01L 23/52* (2006.01)
  *H01L 25/00* (2006.01)
  *H01L 21/768* (2006.01)
  *H01L 23/522* (2006.01)
  *H01L 23/528* (2006.01)
  *H01L 23/00* (2006.01)
  *H01L 25/065* (2006.01)
  *H01L 25/075* (2006.01)

(52) U.S. Cl.
  CPC .... *H01L 21/76898* (2013.01); *H01L 23/3114* (2013.01); *H01L 23/528* (2013.01); *H01L 23/5226* (2013.01); *H01L 24/08* (2013.01); *H01L 24/32* (2013.01); *H01L 25/0657* (2013.01); *H01L 25/043* (2013.01); *H01L 25/0756* (2013.01); *H01L 25/117* (2013.01); *H01L 2225/06544* (2013.01); *H01L 2225/06565* (2013.01); *H01L 2225/06582* (2013.01)

(58) Field of Classification Search
  CPC ....... H01L 24/08; H01L 24/32; H01L 25/043; H01L 25/0756; H01L 25/117
  See application file for complete search history.

(56) References Cited

U.S. PATENT DOCUMENTS

| | | | |
|---|---|---|---|
| 5,891,761 A * | 4/1999 | Vindasius et al. .... | 257/E21.705 |
| 7,528,491 B2 * | 5/2009 | Kirby ................ | H01L 21/76898 257/48 |
| 7,531,905 B2 * | 5/2009 | Ishino ................ | H01L 24/73 257/686 |
| 7,772,708 B2 * | 8/2010 | Leddige .............. | H01L 25/0657 257/686 |
| 7,791,175 B2 * | 9/2010 | Pyeon ................ | G11C 5/02 257/621 |
| 7,795,073 B2 * | 9/2010 | Han .................. | H01L 21/6835 257/E21.237 |
| 7,795,139 B2 * | 9/2010 | Han .................. | H01L 21/76898 257/E23.067 |
| 7,838,967 B2 * | 11/2010 | Chen ................. | H01L 21/76898 257/621 |
| 7,847,626 B2 * | 12/2010 | Alzheimer .......... | H01L 25/0657 327/407 |
| 7,977,781 B2 * | 7/2011 | Ito .................... | G11C 5/02 257/686 |
| 8,299,592 B2 * | 10/2012 | Suh ................... | H01L 23/481 257/276 |
| 8,373,230 B1 * | 2/2013 | Or-Bach ............. | B82Y 10/00 257/347 |
| 8,395,259 B2 * | 3/2013 | Eun .................. | H01L 21/76898 257/678 |
| 8,455,349 B2 * | 6/2013 | Sasaki ............... | H01L 21/76898 257/774 |
| 8,487,422 B2 * | 7/2013 | Dunne .............. | H01L 21/76898 257/686 |
| 8,674,482 B2 * | 3/2014 | Shi ................... | H01L 21/76898 257/621 |
| 8,836,140 B2 * | 9/2014 | Ma .................... | H01L 21/76898 257/71 |
| 8,957,695 B2 * | 2/2015 | Takahashi ............ | H01L 22/32 257/48 |
| 8,970,047 B2 * | 3/2015 | Chen ................. | H01L 21/6835 257/670 |
| 9,318,397 B2 * | 4/2016 | Yamaoka ............ | H01L 23/5286 |
| 9,490,897 B2 * | 11/2016 | DeCusatis ........... | G02B 6/00 |
| 2003/0162326 A1 * | 8/2003 | Tsubosaki et al. ... | 438/125 |
| 2006/0208351 A1 * | 9/2006 | Poo ................... | H01L 23/49805 257/693 |
| 2006/0278979 A1 * | 12/2006 | Rangel ............... | H01L 23/481 257/734 |
| 2008/0032448 A1 * | 2/2008 | Simon ................ | H01L 21/76898 438/107 |
| 2008/0237844 A1 * | 10/2008 | Aleksov ............. | H01L 23/3731 257/713 |
| 2008/0253085 A1 * | 10/2008 | Soffer ............... | G06F 1/18 361/679.4 |
| 2008/0311701 A1 * | 12/2008 | Yang ................. | H01L 21/563 438/108 |
| 2009/0108469 A1 | 4/2009 | Kang et al. | |
| 2010/0187671 A1 * | 7/2010 | Lin ................... | H01L 21/76898 257/686 |
| 2010/0224977 A1 * | 9/2010 | Kim .................. | H01L 21/76898 257/686 |
| 2010/0285635 A1 * | 11/2010 | Jo .................... | H01L 21/76898 438/109 |
| 2011/0117739 A1 * | 5/2011 | Tuttle ............... | H01L 21/76898 438/667 |
| 2011/0127679 A1 | 6/2011 | Eun | |
| 2011/0272798 A1 * | 11/2011 | Lee .................. | H01L 25/0657 257/735 |
| 2011/0309518 A1 * | 12/2011 | Kim .................. | H01L 25/0657 257/774 |
| 2012/0061842 A1 * | 3/2012 | Kim .................. | H01L 23/16 257/769 |
| 2012/0175783 A1 * | 7/2012 | Suh .................. | H01L 21/76898 257/774 |
| 2013/0162282 A1 * | 6/2013 | Hatakeyama ......... | H01L 22/30 324/762.01 |
| 2013/0236993 A1 * | 9/2013 | Lee et al. ............ | 438/107 |
| 2014/0048948 A1 | 2/2014 | Lee | |
| 2014/0054761 A1 * | 2/2014 | Lin .................. | H01L 21/76898 257/692 |
| 2014/0071652 A1 | 3/2014 | McShane et al. | |
| 2015/0279431 A1 * | 10/2015 | Li .................... | H01L 25/50 365/51 |
| 2015/0325550 A1 * | 11/2015 | Zhao ................. | 438/107 |
| 2016/0005713 A1 * | 1/2016 | Chen ................. | H01L 25/50 257/774 |
| 2017/0256501 A1 * | 9/2017 | Chao ................. | H01L 23/544 |
| 2017/0308133 A1 * | 10/2017 | Soffer ............... | G06F 1/18 |

OTHER PUBLICATIONS

Response to Office Action filed Jun. 22, 2018 in Taiwan Patent Application No. 105144304.
Office Action dated Jun. 27, 2018 in Chinese Patent Application No. 201610260314.4.
English language abstract for CN101425508 published May 6, 2009.
English language abstract for CN102820283 published Dec. 12, 2012.
Response to Office Action filed Nov. 13, 2018, with English language translation of claims as amended therein, in Chinese Patent Application No. 201610260314.4.
Supplemental Response to Office Action filed Nov. 15, 2018, with English language translation of claims as amended therein, in Chinese Patent Application No. 201610260314.4.

* cited by examiner

SEMICONDUCTOR DEVICE INCLUDING STACKED DIE WITH CONTINUOUS INTEGRAL VIA HOLES

CLAIM OF PRIORITY

This application claims priority to Chinese Patent Application No. 201610260314.4 filed Apr. 25, 2016, which application is incorporated by reference herein in its entirety.

BACKGROUND OF THE INVENTION

Field

The present technology relates to semiconductor devices.

Description of Related Art

The strong growth in demand for portable consumer electronics is driving the need for high-capacity storage devices. The semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

DESCRIPTION OF THE DRAWINGS

FIG. 2A to FIG. 2J are schematic side views showing different stages of the fabricating method shown in FIG. 1.

FIG. 4A to FIG. 4F are schematic side views showing different stages of the fabricating method shown in FIG. 3.

FIG. 6A to FIG. 6E are schematic side views showing different stages of the fabricating method shown in FIG. 5.

DETAILED DESCRIPTION

Embodiments will now be described with reference to FIGS. 3 through 7, which relate to fabricating methods of a semiconductor device and a semiconductor device. It is understood that the present technology may be embodied in many different forms and should not be construed as being limited to the embodiments set forth herein. Rather, these embodiments are provided so that this disclosure will be thorough and complete and will fully convey the present technology to those skilled in the art. Indeed, the present technology is intended to cover alternatives, modifications and equivalents of these embodiments, which are included within the scope and spirit of the invention as defined by the appended claims. Furthermore, in the following detailed description of the present technology, numerous specific details are set forth in order to provide a thorough understanding of the present technology. However, it will be clear to those of ordinary skill in the art that the present technology may be practiced without such specific details.

The terms "left", "right", "top," "bottom," "upper," "lower," "vertical" and/or "lateral" as may be used herein are for convenience and illustrative purposes only, and are not meant to limit the description of the present technology inasmuch as the referenced item can be exchanged in position. Also, as used herein, the articles "a" and "an" are intended to include both single and plurality forms, unless the content clearly indicates otherwise. The terms "substantially" and/or "about" mean that the specified dimension or parameter may be varied within an acceptable manufacturing tolerance for a given application. In one embodiment, the acceptable manufacturing tolerance is ±0.25%.

Throughout the figures, same or similar components are labeled in the same fashion with the same last two digits.

While various packaging configurations are known, semiconductor memory devices can be fabricated in a form of a three-dimensional system in packaging (3D-SiP). Through silicon via (TSV) interconnection is one of the 3D-SiP technology known for short interconnection distance and fast speed. TSV is a technique that produces vertical via holes in semiconductor dies, and deposits a conductive material in vertical via holes by an electroplating process to implement the interconnection.

Figure 1:
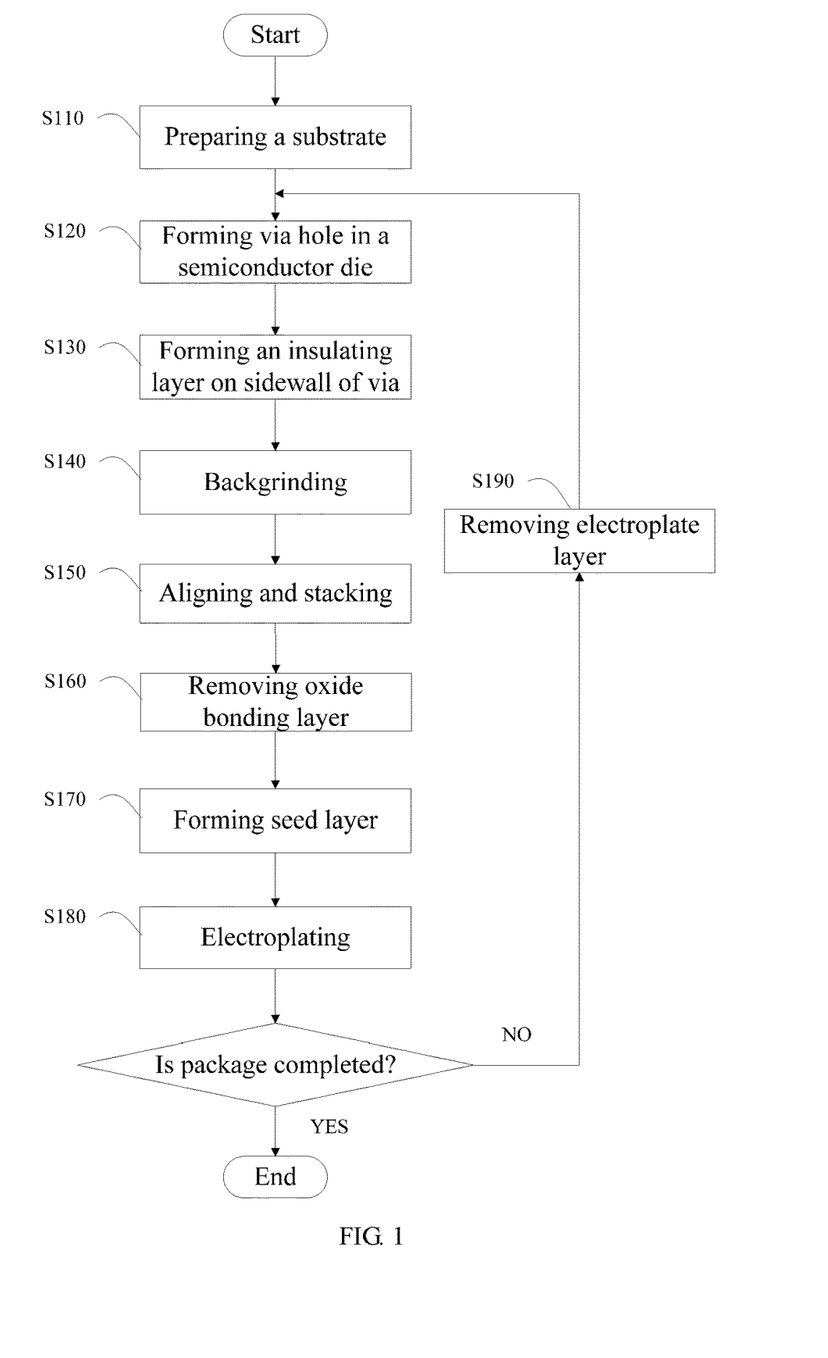
FIG. 1 a flow chart of a fabricating method of a semiconductor device with a TSV structure.

FIG. 1 is a flow chart of a fabricating method of a semiconductor device with a TSV structure. FIG. 2A to FIG. 2J are schematic side views showing different stages of the fabricating method shown in FIG. 1.

Figure 2A:
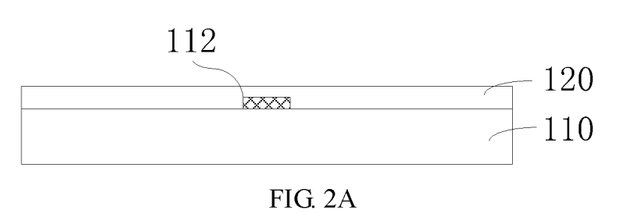

As shown in FIG. 1, the method starts with a step S110 of preparing a substrate. As shown in FIG. 2A, a substrate 110 includes a bonding pad 112 on the upper surface of the substrate 110 and an oxide bonding layer 120 formed on the upper surface of the substrate 110 and covering the bonding pad 112. The bonding pad 112 is electrically connected to semiconductor dies to be disposed on the substrate 110 in subsequent processes. The oxide bonding layer 120 serves as a bonding layer for attaching the semiconductor die.

Figure 2B:
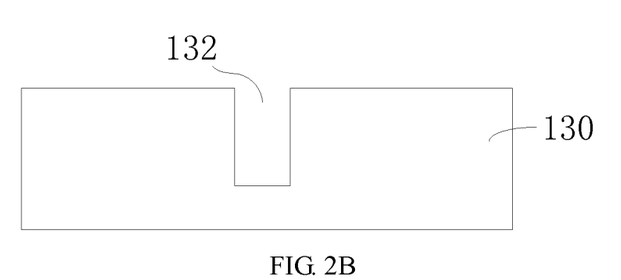
Figure 2C:
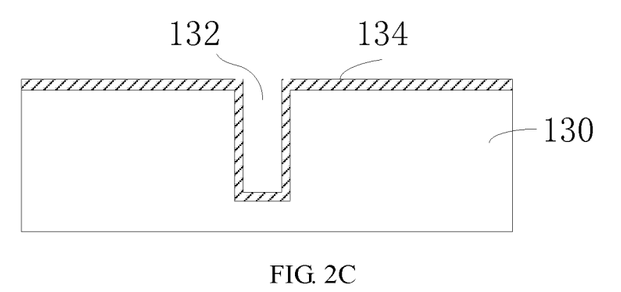
Figure 2D:
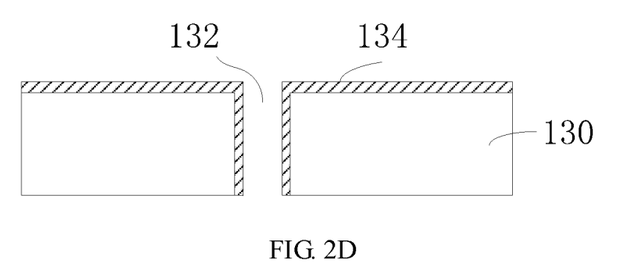

Next, as shown in FIG. 2B to FIG. 2D, a via hole 132 is formed in a semiconductor die 130 in a step S120, and then an insulating layer 134 is formed on the side wall of the via 132 in a step S130, followed by a backside grinding step S140 to reduce the thickness of the semiconductor die 130 so as to form a through via hole 132 in the semiconductor die 130.

Figure 2E:
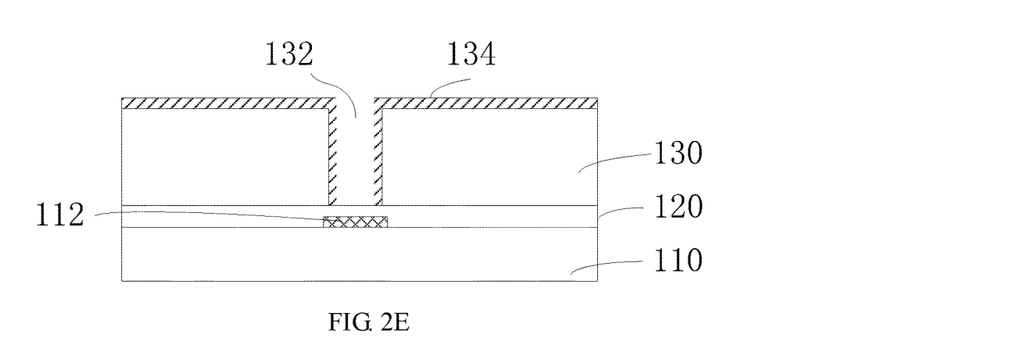

Next, as shown in FIG. 2E, the semiconductor die 130 is stacked and attached on the substrate 110 via the oxide bonding layer 120 with the through via hole 132 of the semiconductor die 130 aligned with the bonding pad 112 of the semiconductor substrate 110 buried beneath the oxide bonding layer 120 in a step S150. The alignment of the semiconductor die 130 on the substrate 110 is typically implemented by a pattern recognition system including an image capturing device, which identifies fiducial marks located on the semiconductor die 130 and the substrate 110. Those fiducial marks can be made of metallic pad which has an image contrast with respect to the coating applied on the substrate. The pattern recognition system utilizes the fiducial marks to register and calibrate coordination information of the semiconductor die 130 relative to the substrate 110. Since the bonding pad 112 is covered by the oxide bonding layer 120 in the above fabricating process, it cannot be used as a fiducial mark since it is not visible for the image capturing device of the patterning recognition system. In this case, additional fiducial marks (not shown) are formed on the substrate 110 so as to align the semiconductor die 130 and the substrate 110 by the pattern recognition system.

Figure 2F:
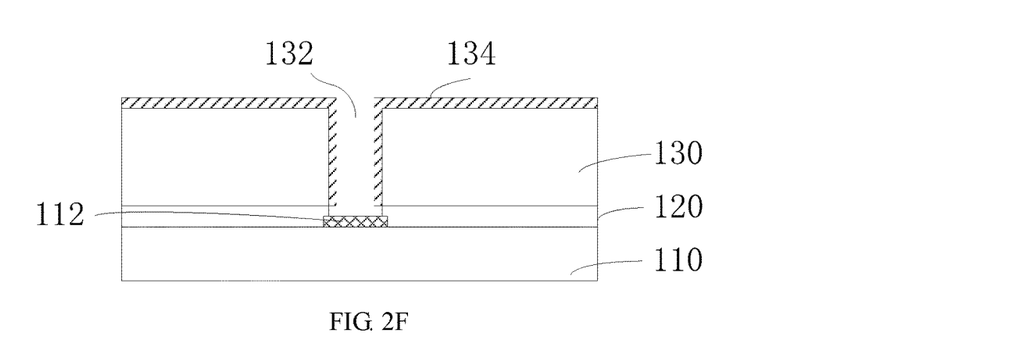
Figure 2G:
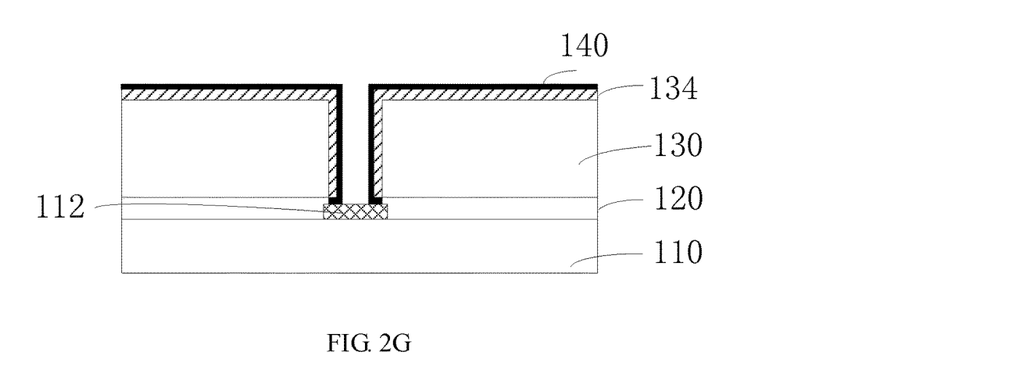
Figure 2H:
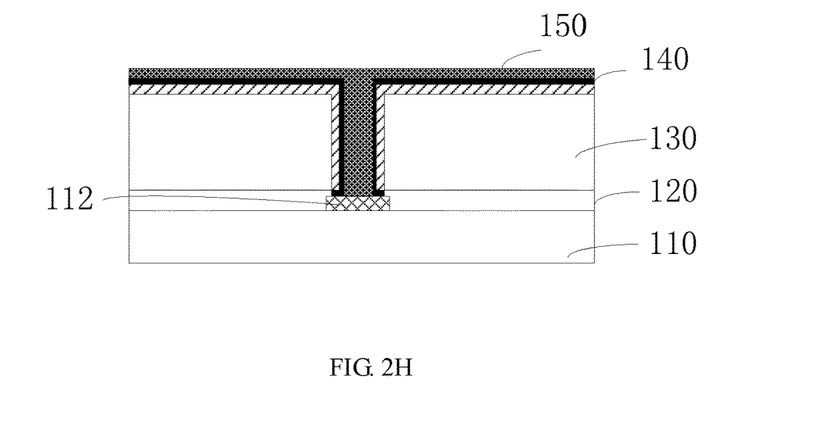
Figure 2I:
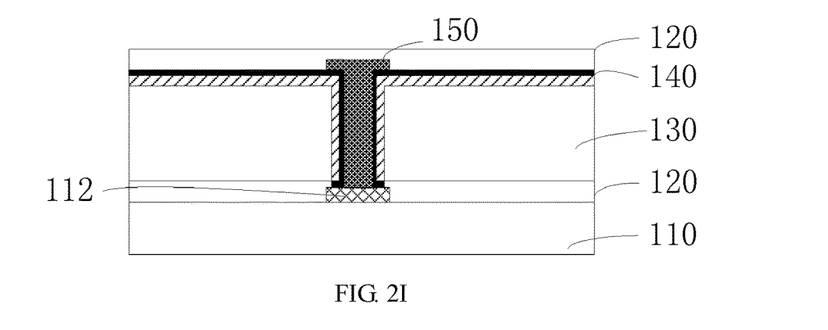

Next, the oxide bonding layer 120 above the bonding pad 112 is removed in a step S160 in order to expose the surface of the bonding pad 112, as shown in FIG. 2F. Next, a seed layer 140 is formed on the exposed surface of the insulating layer 134 in a step S170, as shown in FIG. 2G. Then as shown in FIG. 2H, in a step of S180, a layer of conductive material 150 is deposited on the seed layer 140 by an electroplating process so that the conductive material fills the through via hole 132. If the package includes a single semiconductor die 130, the process for forming the TSV structure in such package ends here. If the package includes more than one semiconductor die 130, the process goes to a step S190, in which the layer of conductive material 150 on the semiconductor die 130 is removed so that the conductive material 150 remains only at a location regions corresponding to the via hole 132 and the bonding pad 112. And the conductive material 150 is covered by an additional oxide bonding layer 120, as shown in FIG. 2I. Then the steps S120 to S180 as described above are repeated for an additional semiconductor die 130. The resulting structure is shown in FIG. 2J.

Figure 2J:
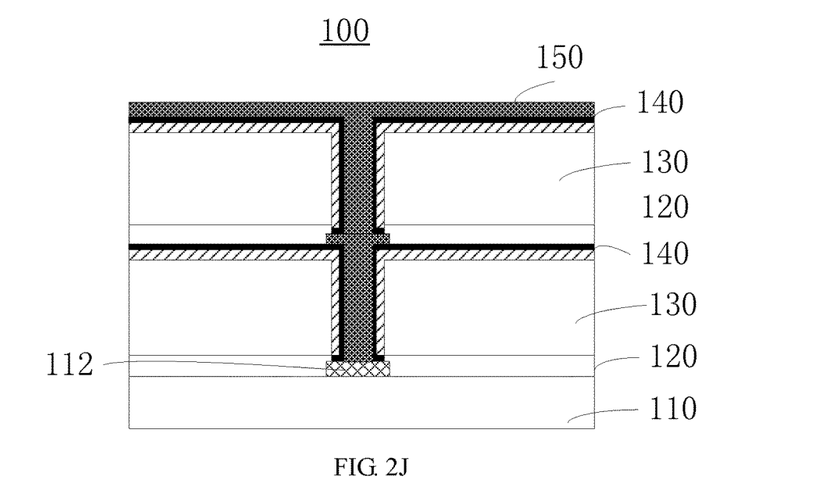

As shown in FIG. 2J, the package 100 includes overlying multiple TSV structures aligned with respect to each other, which might cause misalignment issues. Furthermore, the TSV structures are deposited in multiple steps involving multiple thermal cycles due to multiple electroplating processes, thus creating excessive stress in the regions of TSV structures, weakening mechanical strength of the semiconductor dies 130. Overlying multiple TSV structures might also have increased interface resistivity between TSV structures in the upper and lower semiconductor dies due to interface defects introduced by multiple depositions.

Figure 3:
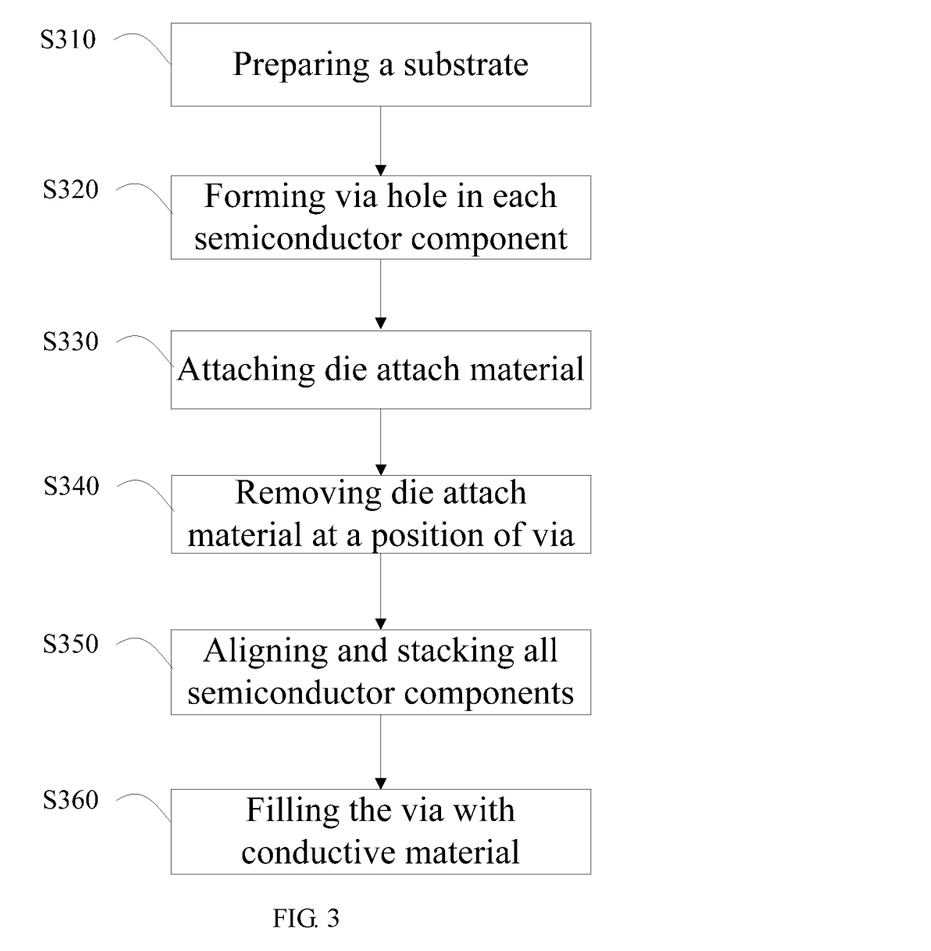
FIG. 3 is a flow chart of a fabricating method of a semiconductor device with a TSV structure according to a first embodiment of the present technology.

A fabricating method of a semiconductor device according to a first embodiment of the present technology will be described with reference to FIG. 3 to FIG. 4F. FIG. 3 is a flow chart of a fabricating method of a semiconductor device with a TSV structure according to a first embodiment of the present technology. FIG. 4A to FIG. 4F are schematic side views showing different stages of the fabricating method shown in FIG. 3.

Figure 4A:
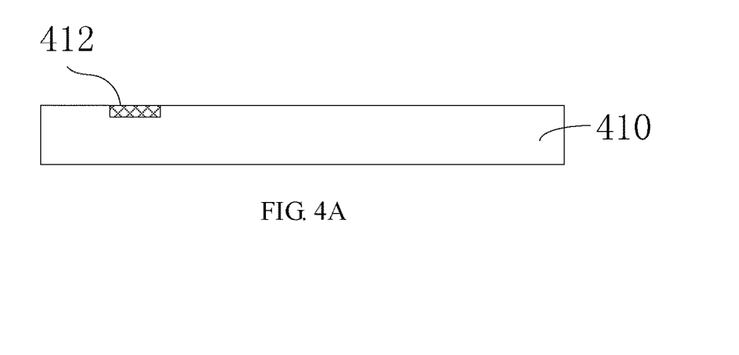

As shown in FIG. 3 and FIG. 4A, the method starts with a step S310 of preparing a substrate. FIG. 4A is a schematic side view of a substrate 410. The substrate 410 can be a wiring board such as a flexible printed circuit board (FPCB) or a temporary carrier for supporting any semiconductor components disposed thereon. For example, the substrate 410 can include conductive patterns formed on one surface or both surfaces of an insulating core layer. The substrate 410 included a bonding pad 412 for electrically connecting with the semiconductor components to be disposed on the substrate 410. For example, the bonding pad 412 is located on the upper surface of the substrate 410 and can be a part of the conductive pattern formed on the upper surface. The bonding pad 412 is for example made of copper, aluminum, gold plated copper, gold plated aluminum.

Figure 4B:
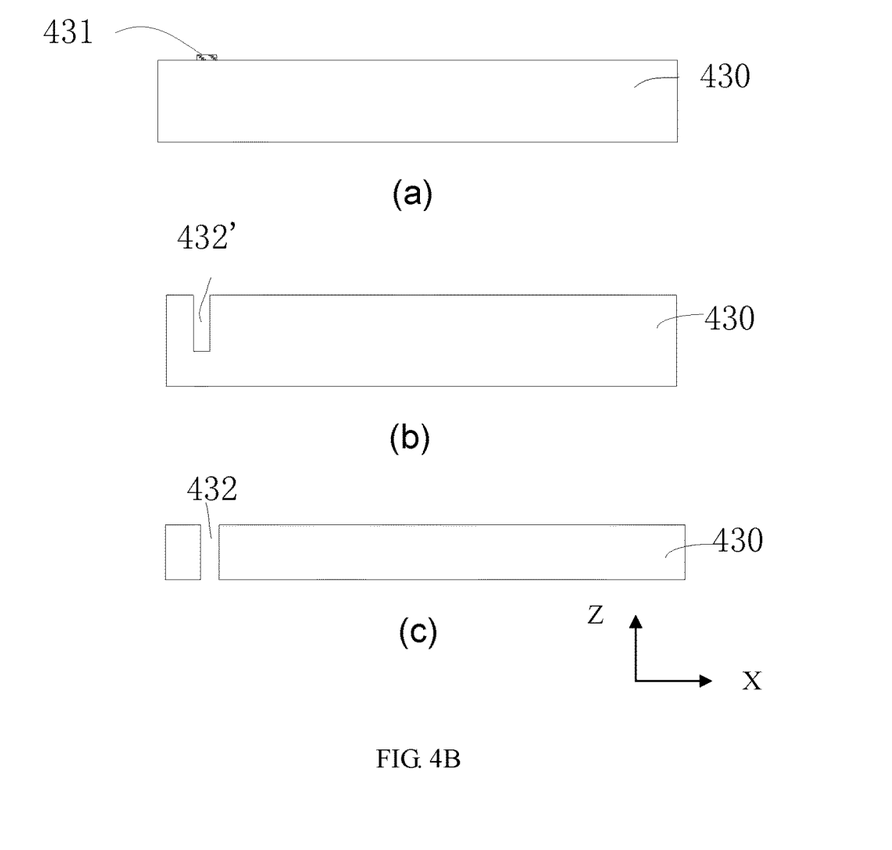

Next, as shown in FIG. 4B, in a step S320, a through via hole 432 is formed in each semiconductor component 430. The through via hole 432 extends completely through the semiconductor component 430 from an upper surface to an opposing lower surface of the semiconductor component 430 in a Z direction, as shown in FIG. 4B. The semiconductor component 430 can include a wafer having an array of dies, or individual die singularized from such wafer. For example, the semiconductor components 430 can be memory dies with substantially same dimensions. Each semiconductor component 430 can be provided with a registration mark 431 indicating the position of the through via hole 432 to be formed. For example, the registration mark 431 is a bonding pad located at the position where the through via hole 432 will be formed on a surface of the semiconductor component 430, as shown in FIG. 4B (a). The number and arrangement of the registration mark 431 is not limited to the embodiment shown in FIG. 4B (a). The registration mark 431 enables accurate and speedy alignment for subsequent processes of forming the through via hole 432.

Next, the through via hole 432 is formed at the location labeled by the registration mark 413. The through via hole 432 can be formed directly to extend completely through the semiconductor component 430 in a Z direction by a dry reactive ion etching (DRIE) process or a laser drilling process, as shown in FIG. 4B (c). Alternatively, the through via hole 432 can be formed by forming a blind via hole 432' extending partially through the semiconductor component 430 in the Z direction, as shown in FIG. 4B (b), followed by a backside grinding process to reduce the thickness of the semiconductor component 430 and form the through via hole 432 to extend completely through the semiconductor component 430 in the Z direction, as shown in FIG. 4B(c). Dry reactive ion etching (DRIE) process or a laser drilling process, or the backside grinding process are known for the skilled in the art and will not be described further in detail. The through via holes 432 located at corresponding alignment locations in the semiconductor components 430 have substantially the same diameters. The number and arrangement of the through via holes 432 in the semiconductor component 430 are not limited to the embodiment shown in FIG. 4B and can be adjusted accordingly.

Figure 4C:
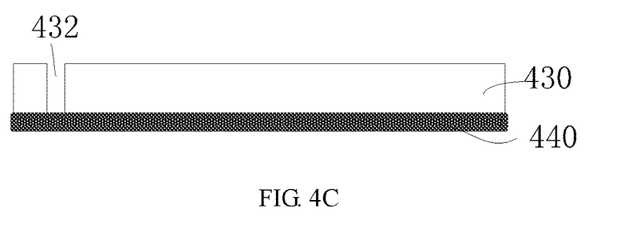
Figure 4D:
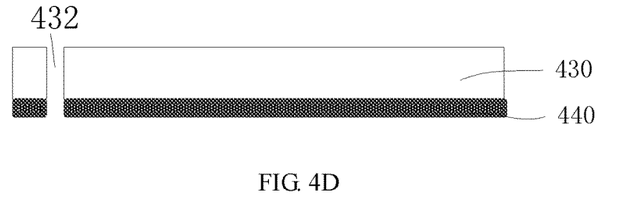

Next, in a step S330, a layer of component attach material 440 is attached on the lower surface of each semiconductor component 440, as shown in FIG. 4C. The layer of component attach material 440 can include a polymeric base with adhesive applied on both surfaces. The layer of the component attach material 440 is for example a die attach film (DAF) used in a conventional die attach process, thus will not be described in further detail herein. Next, in a step S340, the layer of component attach material 440 is removed at a location corresponding to the through via hole 432 of the semiconductor component 430, as shown in FIG. 4D. The component attach material can be removed by any dry etching processes known for the skilled in the art such as a laser ablating process or a laser drilling process, and will not be described in more detail.

Next in a step S350, at least two semiconductor components 430 are aligned and stacked on top of each other on the surface of the substrate 410 formed with the bonding pad 412 via the layer of component attach material 440 attached on the lower surface of the respective semiconductor component 430. Each semiconductor component 430 is positioned so that the through via hole 432 of each semiconductor component 430 is aligned with the bonding pad 412 on the surface of the substrate 410.

Figure 4E:
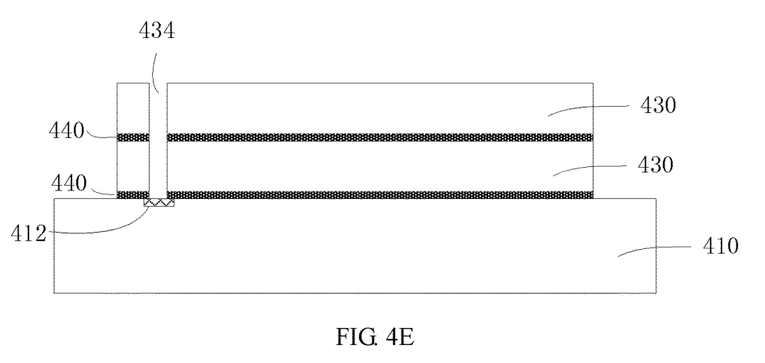
Figure 4F:
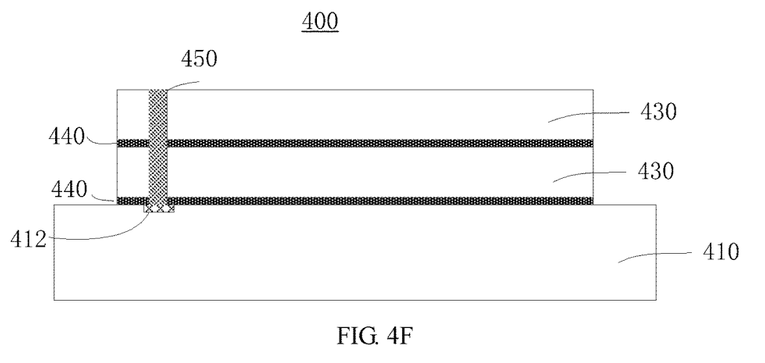

The alignment can be implemented by a typical pattern recognition system described as above for example utilizing the through via hole 432 and the bonding pad 412 as the fiducial marks. In this way, after the step S350, an integral through via hole 434 is formed to extend completely through the at least two semiconductor components 430 and the layers of the die attach material 440, reaching the bonding pad 412 on the substrate 410. Since the aligned through via holes 432 located at corresponding location in the stacked semiconductor components 430 have the same diameter, the integral through via hole 434 composed by those through via holes 432 has a substantially uniform diameter along an extending direction of the integral through via hole 434, as shown in FIG. 4E.

In the first embodiment shown in FIG. 3, a part of layer of the component attach material 440 is removed at a location corresponding to the through via hole 432 in the step S340 before the step S350 of aligning and stacking all semiconductor components 430. The present technology is not limited thereto. The parts of the layer of the component attach material 440 for all stacked semiconductor components 430 can be removed at the location of the through via hole 432 in a single removing process such as a laser drilling process after the step S350 of aligning stacking the semiconductor components 430 so as to form the integral through via hole 434.

Finally, in a step S360, the integral through via hole 434 is filled with a conductive material 450 by a single metal filling process. The conductive material 450 is in physical and electrical connection with the bonding pad 412 on the surface of the substrate 410, thus forming a semiconductor device 400 with a TSV interconnection electrically connecting the semiconductor components 430 and the substrate 410. The conductive material 450 can include gold, copper or other metals or alloys suitable for interconnection and metal filling process. The metal filling process can be an electroplating process known for the skilled in the art. Before the electroplating process, a continuous seed layer (not shown) can be formed on the side wall of the integral through via hole 434 to facilitate such electroplating process. The number and arrangement of TSV interconnections made of conductive material 450 are not limited to the embodiment shown in FIG. 4F and can be adjusted accordingly. The semiconductor device 400 with the TSV interconnections can be further encapsulated in a subsequent molding process known for the skilled in the art.

According to the first embodiment of the present technology shown in FIG. 3, the through via hole 432 of the semiconductor component 430 can be aligned readily with the exposed bonding pad 412 on the surface of the substrate 410 by the typical pattern recognition system, thus improving alignment accuracy. Compared with the oxide bonding layer 120 bonding the semiconductor dies 130 in the semiconductor device 100, the semiconductor components 430 in the semiconductor device 400 are attached by a layer of polymeric component attach material 440 such as DAF, thus enabling low temperature process and reducing overall thickness of the semiconductor device 400 due to the polymeric nature and thin thickness of the component attach material 440. Furthermore, only a single metal filling process is performed on the semiconductor device 400 during the fabricating process according to the present technology, thus reducing the number of thermal cycles, which in turn reduces residual stresses around the TSV structure and improves mechanical strength of the semiconductor device 400. In addition, the TSV structure formed by the conductive material 450 in the semiconductor device 400 is a continuous structure formed in a single metal filling process without interface defects in the semiconductor device 100 shown in FIG. 2J, thus improving conductivity and improving signal transmission. The semiconductor component 430 can be either a wafer or a die, thus the embodiment of the present technology can be applied to a die to die interconnection, a wafer to wafer interconnection, or a die to wafer interconnection.

Figure 5:
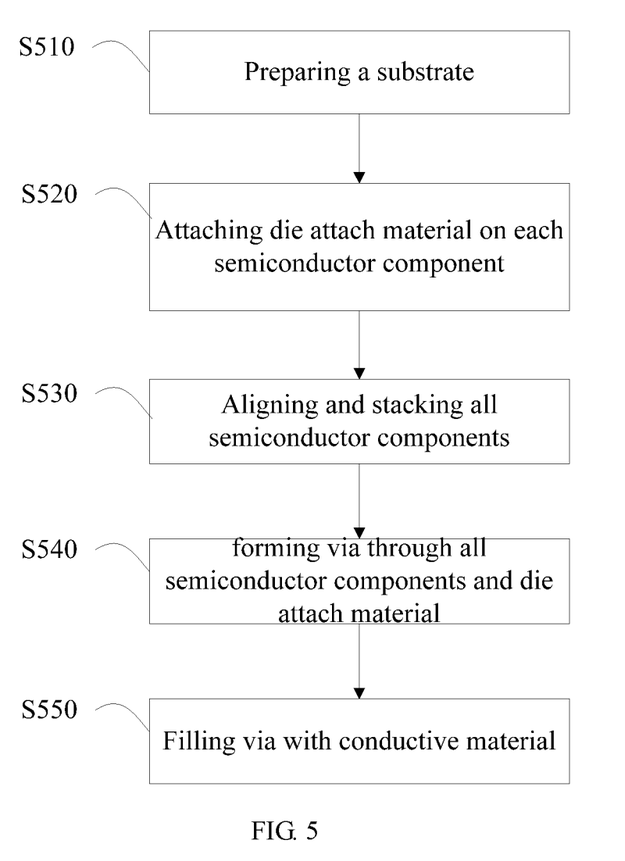
FIG. 5 is a flow chart of a fabricating method of a semiconductor device with a TSV structure according to a second embodiment of the present technology.

In the first embodiment, the through via hole 432 is formed respectively in the individual semiconductor component 430 before the step of aligning and stacking the semiconductor components 430 on the substrate 410. The present technology is not limited thereto. A fabricating method of a semiconductor device according to a second embodiment of the present technology will be described with reference to FIG. 5 to FIG. 6E. FIG. 5 is a flow chart of a fabricating method of a semiconductor device with a TSV structure according to a second embodiment of the present technology. FIG. 6A to FIG. 6E are schematic side views showing different stages of the fabricating method shown in FIG. 5.

Figure 6A:
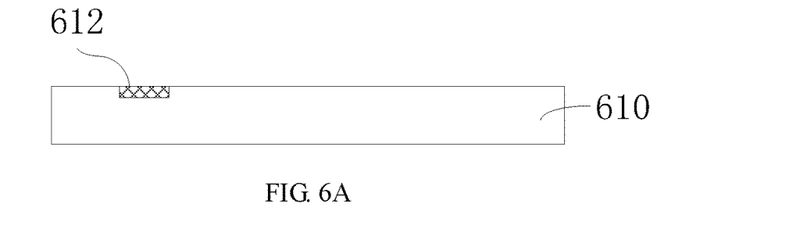

As shown in FIG. 5 and FIG. 6A, the method starts with a step S510 of preparing a substrate. FIG. 6A is a schematic side view of a substrate 610. The substrate 610 is substantially the same as the substrate 410 described in the first embodiment, and thus the description will not be repeated herein.

Figure 6B:
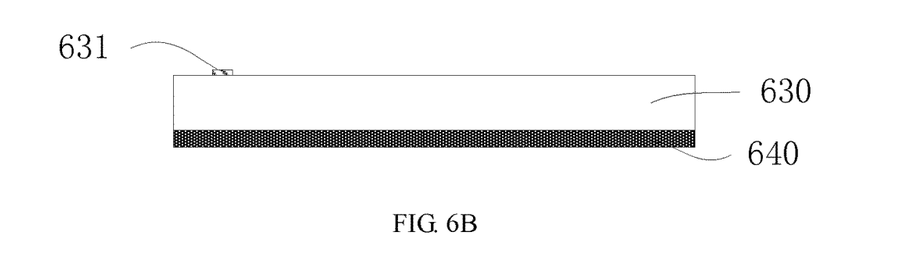

Next, as shown in FIG. 6B, in a step S520, a layer of component attach material 640 is attached on a surface of each semiconductor component 630. Each semiconductor component 630 can be provided with a registration mark 631 indicating the position of the through via hole to be formed. Other aspects of the semiconductor component 630 and the layer of the component attach material 640 are substantially the same as those of the semiconductor component 430 and the layer of the component attach material 440 described in the first embodiment, and thus the description will not be repeated herein.

Figure 6C:
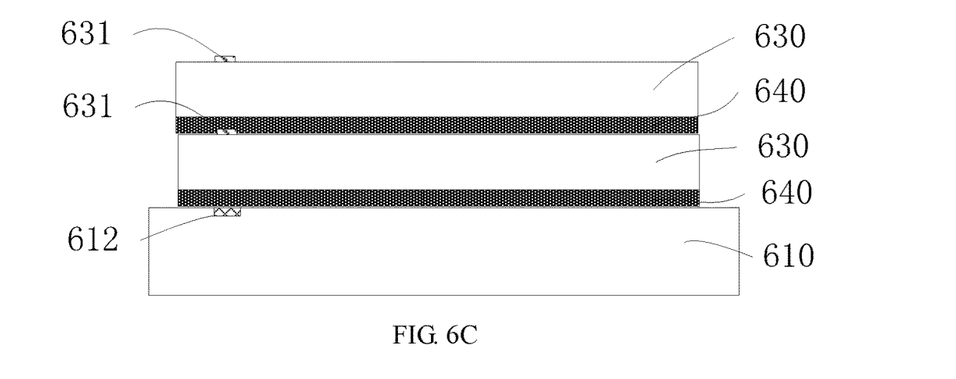

Next, in a step S530, at least two semiconductor components 630 are aligned and stacked on top of each other on the surface of the substrate 610 formed with the bonding pad 612 via the layers of component attach material 640. The alignment is implemented by a typical pattern recognition system utilizing registration marks 631 on each semiconductor components 630 and bonding pad 612 on the substrate 610 as fiducial marks, as shown in FIG. 6C.

Figure 6D:
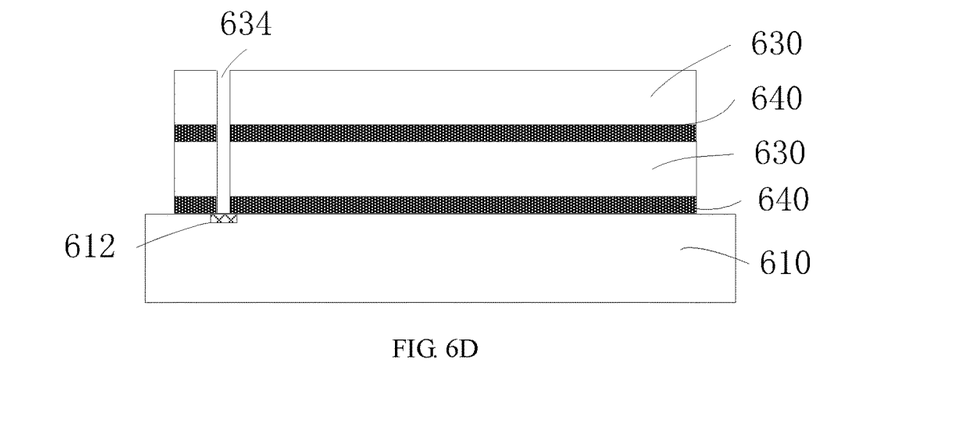

Next, in a step S540, an integral through via hole 634 is formed to extend completely through all semiconductor components 630 and all layers of component attach material 640 at the position of the registration marks 631 to reach the bonding pad 612 by a dry reactive ion etching (DRIE) process or a laser drilling process known for the skilled in the art, as shown in FIG. 6D.

Figure 6E:
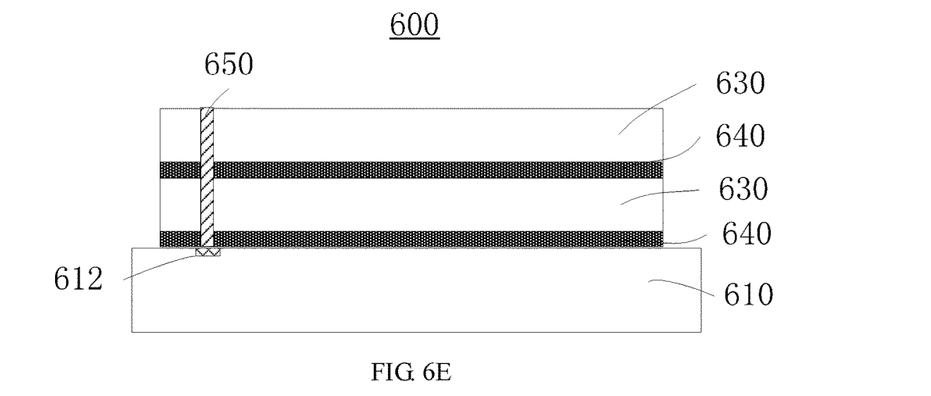

Finally in a step S550, the integral through via hole 634 is filled with a conductive material 650 by a single metal filling process. The conductive material 650 is in physical and electrical connection with the bonding pad 612 on the surface of the substrate 610, thus forming a semiconductor device 600 with a TSV interconnection electrically connecting the semiconductor components 630 and the substrate 610, as shown in FIG. 6E. The semiconductor device 600 with the TSV interconnections can be further encapsulated in a subsequent molding process known for the skilled in the art. Other aspects of the second embodiment of the present technology are substantially the same as those of the first embodiment of the present technology, thus the description will not be repeated herein.

According to the second embodiment of the present technology shown in FIG. 5, the integral through via hole 634 of the semiconductor device 600 is formed after the step of aligning and stacking the semiconductor components 630, thus avoiding misalignment risks for individual through via holes in respective semiconductor components in the first embodiment of the present technology. In this case, the integral through via hole could have a smoother inner surface for further improving uniformity of the continuous conductive material formed within the integral through via hole. However, in comparison with the first embodiment of the present technology, the large aspect ratio of the integral through via hole 634 formed in a single step S540 in the second embodiment increases process complexity and reduces the process tolerance.

Figure 7:
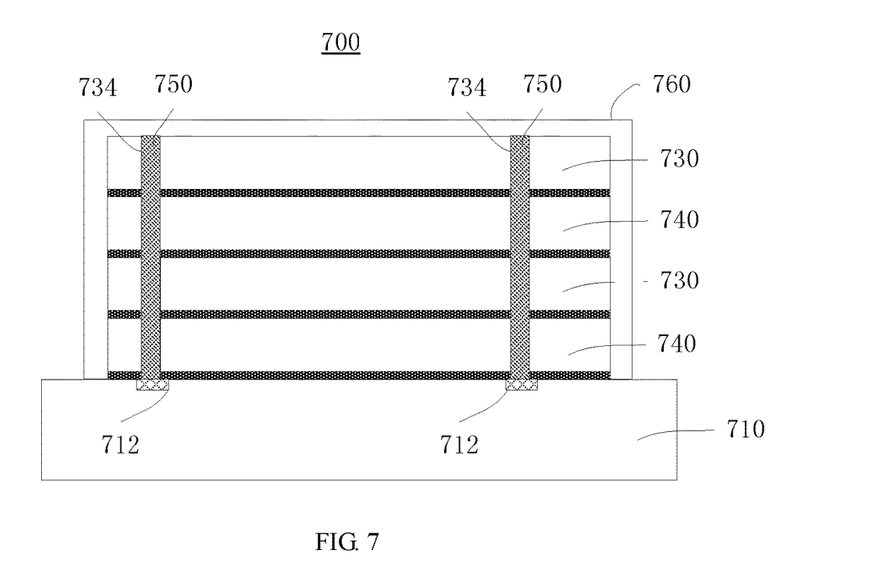
FIG. 7 is a schematic side view of a semiconductor device according to an embodiment of the present technology.

FIG. 4F and FIG. 6E show the semiconductor device 400 and the semiconductor device 600 including two semiconductor components and a single TSV interconnection respectively according to the embodiments of the present technology, respectively. The present technology is not limited thereto and can include more semiconductor components and TSV interconnections. FIG. 7 is a schematic side view of a semiconductor device 700 according to an embodiment of the present technology.

As shown in FIG. 7, the semiconductor device 700 includes a substrate 710 having a plurality of bonding pads 712 on a surface of the substrate 710. The substrate 710 can be a wiring board such as a flexible printed circuit board (FPCB). In particular, the substrate 710 includes conductive pattern layers applied on both surfaces of an insulating core layer, which is not shown in detail. The insulating core layer can be made of various dielectric materials such as for example, polyimide laminates, epoxy resins including FR4 and FR5, bismaleimide triazine (BT), or prepeg (PP) material.

The semiconductor device 700 further includes a plurality of semiconductor components 730 stacked on top of each other on the surface of the substrate 710 via a respective layer of component attach material 740 attached on a lower surface of each semiconductor component 730. The semiconductor component 730 can be either a wafer or a die, thus the embodiment of the present technology can be applied to a die to die interconnection, a wafer to wafer interconnection, or a die to wafer interconnection. The number of the semiconductor components in the present embodiment is not limited to four as shown in FIG. 7 and can be adjusted if necessary.

The semiconductor device 700 further includes a plurality of integral through via holes 734. Each integral through via hole 734 extends completely through all semiconductor components 730 and the layers of component attach material 740. Each integral through via hole 734 has a substantially uniform diameter along an extending direction of the respective integral through via hole 734, and is aligned with the corresponding bonding pad 712 on the surface of the substrate 710. The conductive material 750 is filled in the respective integral through via hole 734 by a single metal filling step such as an electroplating process to form respective TSV interconnection. In such case, the conductive material 750 is in physical and electrical contact with the corresponding bonding pad 712 of the substrate 710 and continuous throughout the integral through via hole 734 without additional interfaces. The semiconductor device 700 can further include a seeding layer (not shown) formed on the side wall of each integral through via hole 734 to facilitate the electroplating process. The number of TSV interconnections in the present embodiment is not limited to two as shown in FIG. 7 and can be adjusted if necessary. In addition, the semiconductor device 700 can further include a molding compound 760 encapsulating the semiconductor components 730 on the substrate 710.

According to the embodiments of the present technology, an integral through via hole with a substantially same diameter is formed through the semiconductor components stacked on the substrate for the TSV interconnection, thus improving structure integrity and mechanical strength of the semiconductor device with the TSV interconnection. In addition, the continuous conductive material filled in the integral through via hole by the single metal filling step has improved conductivity due to less interface defects in comparison with the conventional semiconductor device having the TSV structure formed with multiple electroplating processes.

In an aspect of the present technology, a method of fabricating a semiconductor device comprising following step. At least two semiconductor components are provided. Each semiconductor component has a first surface and a second surface opposite the first surface. A through via hole is formed in each semiconductor component. The through via hole extends completely through the respective semiconductor component from the first surface to the second surface. A layer of component attach material is attached on the second surface of each semiconductor component. The component attach material is removed at a position corresponding to the through via hole in each semiconductor component. The at least two semiconductor components are aligned and stacked on a surface of a substrate on top of each other via the layer of component attach material. The through via holes of semiconductor components are aligned with each other to form an integral through via hole completely through the at least two semiconductor components and all layers of component attach material, and having a substantially uniform diameter along an extending direction of the integral through via hole. Finally, the integral through via hole is filled with a conductive material by a single metal filling process.

In embodiments, each semiconductor component is provided with a registration mark located on the first surface and marking the position of the through via hole. The registration mark can comprise a pad at the position of the through via hole on the first surface of the respective semiconductor component.

In embodiments, the through via hole is formed directly to extend completely through the respective semiconductor component by a dry reactive ion etching (DRIE) process or a laser drilling process. Alternatively, the through via hole is formed by forming a blind via hole partially through the respective semiconductor component by a dry reactive ion etching (DRIE) process or a laser drilling process, followed by a backside grinding process on the second surface of the semiconductor component to form the through via hole completely through the respective semiconductor component.

In embodiments, the substrate further comprises a bonding pad on the surface of the substrate. The through via holes of the at least two semiconductor components are aligned with the bonding pad on the surface of the substrate in the step of aligning and stacking the at least two semiconductor components on a surface of a substrate, and the conductive material in the integral through hole is in physical and electrical contact with the bonding pad on the surface of the substrate.

In embodiments, each semiconductor component is either a die or a wafer.

In another aspect of the present technology, a method of fabricating a semiconductor device comprising following steps. At least two semiconductor components are provided. Each semiconductor component has a first surface and a second surface opposite the first surface. A layer of component attach material is attached on the second surface of each semiconductor component. The at least two semiconductor components are aligned and stacked on top of each other on a surface of a substrate via the layer of component attach material. An integral through via hole is formed to extend completely through the at least two semiconductor components and the layers of component attach material and having a substantially uniform diameter along an extending direction of the integral through via hole. A conductive material is filled in the integral through via hole by a single metal filling process.

In another aspect of the present technology, a semiconductor device comprises: a substrate having a bonding pad on a surface of the substrate; at least two semiconductor components each having a first surface and a second surface opposite the first surface, the semiconductor components stacked on top of each other on the surface of the substrate via a layer of component attach material attached on the second surface of the respective semiconductor component; an integral through via hole extending completely through the semiconductor components and the layers of component attach material and having a substantially uniform diameter along an extending direction of the integral through via hole aligned with the bonding pad on the surface of the substrate, and a continuous conductive material filled in the integral through via hole and in physical and electrical contact with the bonding pad of the substrate.

In embodiments, each semiconductor component is either a die or a wafer. The die comprises a controller die or a memory die. The semiconductor device can further comprise a continuous metal seed layer disposed on the inner side wall of the integral through via hole. The semiconductor can further comprise a molding compound encapsulating the at least two semiconductor components stacked on the surface of the substrate.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device comprising:
   a substrate having a bonding pad on a surface of the substrate;
   at least two semiconductor components, each semiconductor component having a first surface and a second surface opposite the first surface, the at least two semiconductor components stacked on top of each other on the surface of the substrate via a layer of component attach material attached on the second surface of the respective semiconductor component;
   an integral through via hole extending completely through the at least two semiconductor components and the layers of component attach material, and the integral through via hole aligned with the bonding pad on the surface of the substrate, and
   a continuous conductive material plated within the integral through via hole and in physical and electrical contact with the bonding pad of the substrate.

2. The semiconductor device of claim 1, wherein each semiconductor component is either a die or a wafer.

3. The semiconductor device of claim 2, wherein the die comprises a controller die or a memory die.

4. The semiconductor device of claim 1, further comprising a continuous metal seed layer disposed on the inner side wall of the integral through via hole.

5. The semiconductor device of claim 1, further comprising a molding compound encapsulating the at least two semiconductor components stacked on the surface of the substrate.

6. A semiconductor device comprising:
   a substrate having a bonding pad on a surface of the substrate, the bonding pad comprising a fiducial mark;
   at least two semiconductor components, each semiconductor component having a first surface and a second surface opposite the first surface, the at least two semiconductor components stacked on top of each other on the surface of the substrate based on a position of the fiducial mark;
   an integral through via hole extending completely through the at least two semiconductor components, and the integral through via hole aligned with the bonding pad on the surface of the substrate, and
   a continuous conductive material filled without gap in the integral through via hole and in physical and electrical contact with the bonding pad of the substrate.

7. The semiconductor device of claim 6, wherein each semiconductor component is either a die or a wafer.

8. The semiconductor device of claim 7, wherein the die comprises a controller die or a memory die.

9. The semiconductor device of claim 6, further comprising a continuous metal seed layer disposed on the inner side wall of the integral through via hole.

10. A semiconductor device comprising:
    a substrate having a bonding pad on a surface of the substrate;
    at least first and second semiconductor components, each semiconductor component having a first surface and a second surface opposite the first surface, the at least first and second semiconductor components stacked on top of each other, the second semiconductor component lying directly against the surface of the substrate;
    an integral through via hole extending completely through the at least two semiconductor components, and the integral through via hole aligned with the bonding pad on the surface of the substrate, and
    a continuous conductive electroplated material at least partially filling the integral through via hole and in physical and electrical contact with the bonding pad of the substrate.

11. The semiconductor device of claim 10, wherein each semiconductor component is either a die or a wafer.

12. The semiconductor device of claim 11, wherein the die comprises a controller die or a memory die.

13. The semiconductor device of claim 10, further comprising a continuous metal seed layer disposed on the inner side wall of the integral through via hole.

* * * * *